(12) United States Patent
Krivokapic

(10) Patent No.: US 6,501,134 B1
(45) Date of Patent: Dec. 31, 2002

(54) ULTRA THIN SOI DEVICES WITH IMPROVED SHORT-CHANNEL CONTROL

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/845,593

(22) Filed: Apr. 30, 2001

Related U.S. Application Data
(60) Provisional application No. 60/260,484, filed on Jan. 9, 2001.

(51) Int. Cl.[7] .............................................. H01L 27/01
(52) U.S. Cl. ..................... 257/350; 257/344; 257/347; 257/336
(58) Field of Search .................................. 257/347, 336, 257/344, 350, 289

(56) References Cited

U.S. PATENT DOCUMENTS

| | | | | |
|---|---|---|---|---|
| 4,847,670 A | * | 7/1989 | Monkowski et al. | ......... 357/34 |
| 5,358,879 A | * | 10/1994 | Brady et al. | .................. 437/21 |
| 5,894,152 A | * | 4/1999 | Jaso et al. | .................. 257/347 |
| 6,337,505 B2 | * | 1/2002 | Hwang et al. | .............. 257/401 |

* cited by examiner

*Primary Examiner*—Richard Elms
*Assistant Examiner*—Brad Smith
(74) *Attorney, Agent, or Firm*—Deborah Wenocur; Gerald Fisher

(57) ABSTRACT

An improved Silicon-On-Insulator (SOI) device structure with a thin SOI silicon layer maintains excellent $I_{off}$ DC characteristics without degrading device AC speed and characteristics. The device structure comprises double gate sidewall spacers including an inner polysilicon spacer and an outer dielectric (nitride or oxide) sidewall spacer.

3 Claims, 4 Drawing Sheets

ULTRA THIN SOI DEVICES WITH IMPROVED SHORT-CHANNEL CONTROL

CROSS-REFERENCE TO RELATED APPLICATIONS

This application claims the benefit of U.S. Provisional Application No. 60/260,484, filed on Jan. 9, 2001.

FIELD OF THE INVENTION

This invention relates to semiconductor device structures, and in particular to ultra-thin Silicon-On-Insulator (SOI) devices structures.

BACKGROUND OF THE INVENTION

As integrated circuit dimensions decrease and circuit speed increases, new transistor structures have been developed in order to yield good performance at the smaller dimensions. In particular, Silicon-On-Insulator (SOI) devices are known and are generally undoped or very lightly doped silicon on a low K dielectric. SOI devices are characterized by having the active device region insulated from the bulk substrate, generally by a buried oxide layer. The active device region is thereby said to be floating. SOI devices have been developed which consume less power than do bulk CMOS devices, and which operate at higher speeds than do Ct bulk CMOS devices. FIG. 1 shows a prior art SOI device, including bulk substrate 2, buried oxide layer 4, SOI silicon layer 6, field oxide regions 7, gate dielectric layer 8, conducting gate 10, gate sidewall spacers 11, doped source and drain regions 12, and channel region 14. Source and drain regions may overlap the gate region, or gate sidewall spacer technology may be used to provide separation, or underlap, between the gate and the source-drain regions.

For SOI devices having channel lengths below about 50 nm, it is very difficult to achieve good short-channel control, i.e., to effectively shut off the transistors in the off state, without significantly thinning down the thickness of the buried layer and the thickness of the SOI silicon layer, which is technically very challenging. For a device with SOI silicon thickness of less than 20 nm, an underlap of the source/drain regions with the gate is needed in order to be able to turn off the device. Accordingly, the details of the gate sidewall spacer technology used in the fabrication of such devices are critical to their performance. By way of example, it is known that if doped polysilicon spacers are used in place of nitride spacers (termed a "straddled gate device"), the device DC characteristics improve significantly. The polysilicon spacer which is also doped during source/drain implant serves as a side gate with a lower work function It behaves like a longer gate when there is no bias applied on the gate (i.e., in the $I_{off}$ condition). The polysilicon side gate causes the surface beneath it to invert at much lower applied voltage than the voltage necessary to invert the main channel region, due to the lower work function of the polysilicon. This causes the device to behave like a very short channel device during $I_{on}$ conditions. The result is a much improved $I_{on}$ and $I_{off}$. However, when single layer polysilicon gate sidewall spacers are used, the source/drain extension regions reach under the poly spacers and cause an increased overlap capacitance which slows down the AC device performance.

BRIEF SUMMARY OF THE INVENTION

It is therefore an object of this invention to provide a Silicon-On-Insulator device structure with a thin SOI silicon layer which maintains excellent $I_{off}$ DC characteristics without degrading device AC speed and characteristics.

These objects are met by providing double gate sidewall spacers including an inner polysilicon spacer and an outer dielectric (nitride or oxide) sidewall spacer.

DETAILED DESCRIPTION OF THE INVENTION

Figure 1:
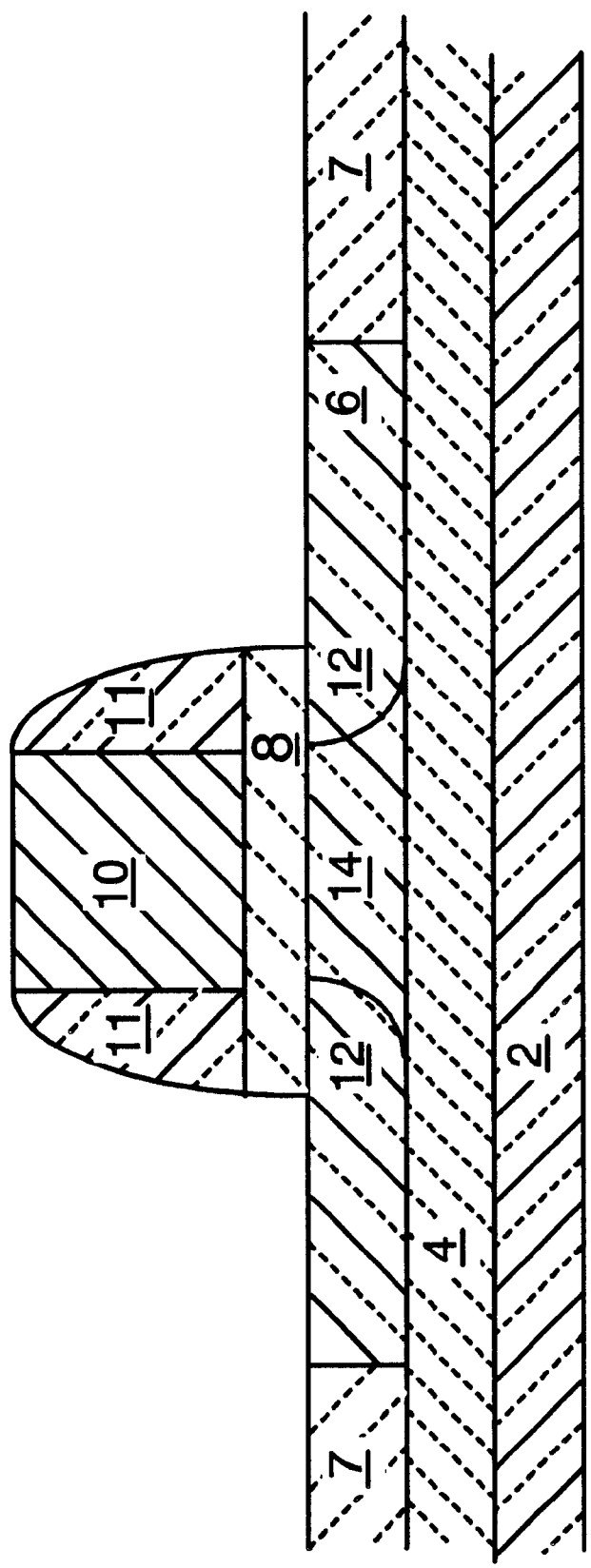
FIG. 1 shows a prior art SOI device structure.
Figure 2A:
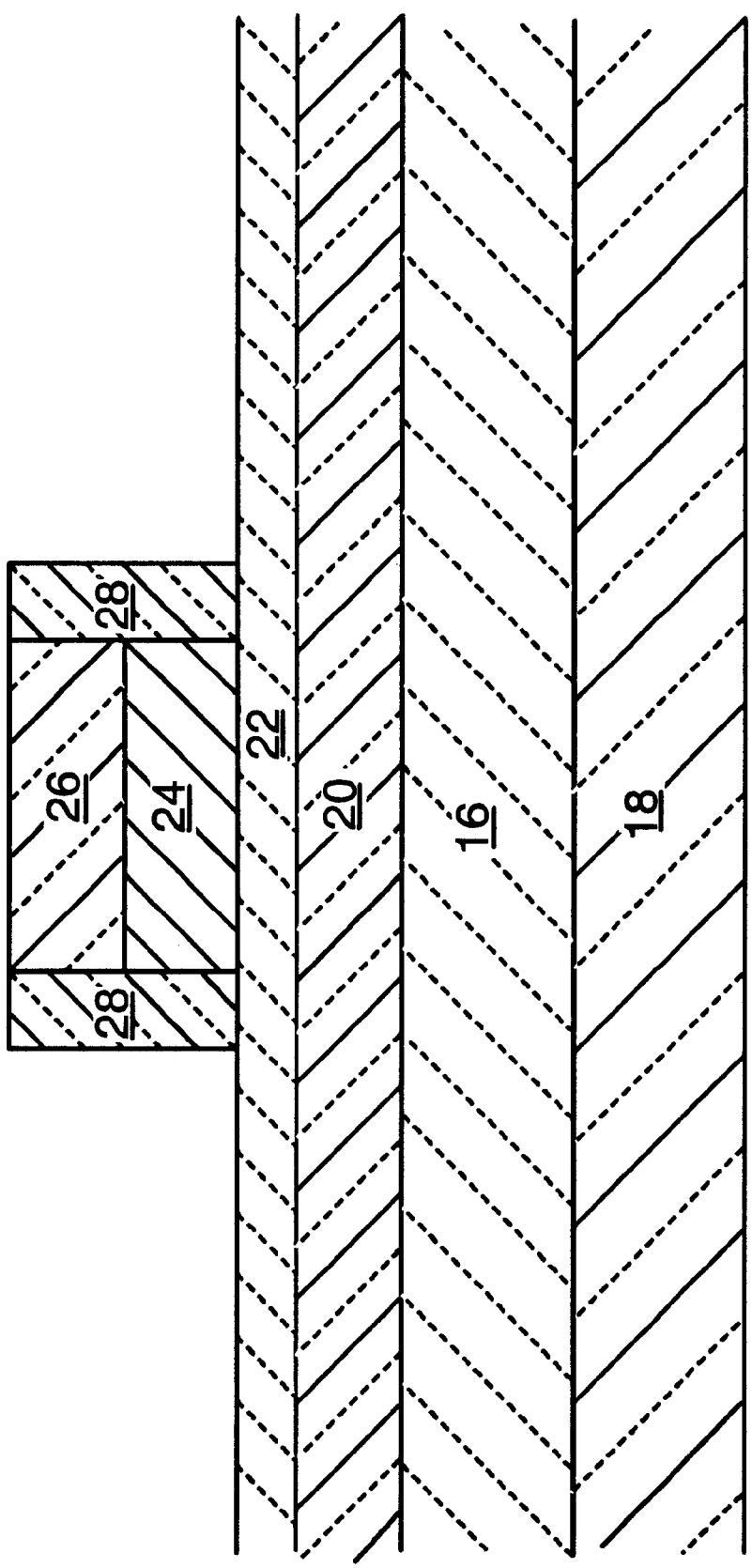
FIG. 2a shows the intermediate inventive device structure having polysilicon gate sidewall spacers.
Figure 2B:
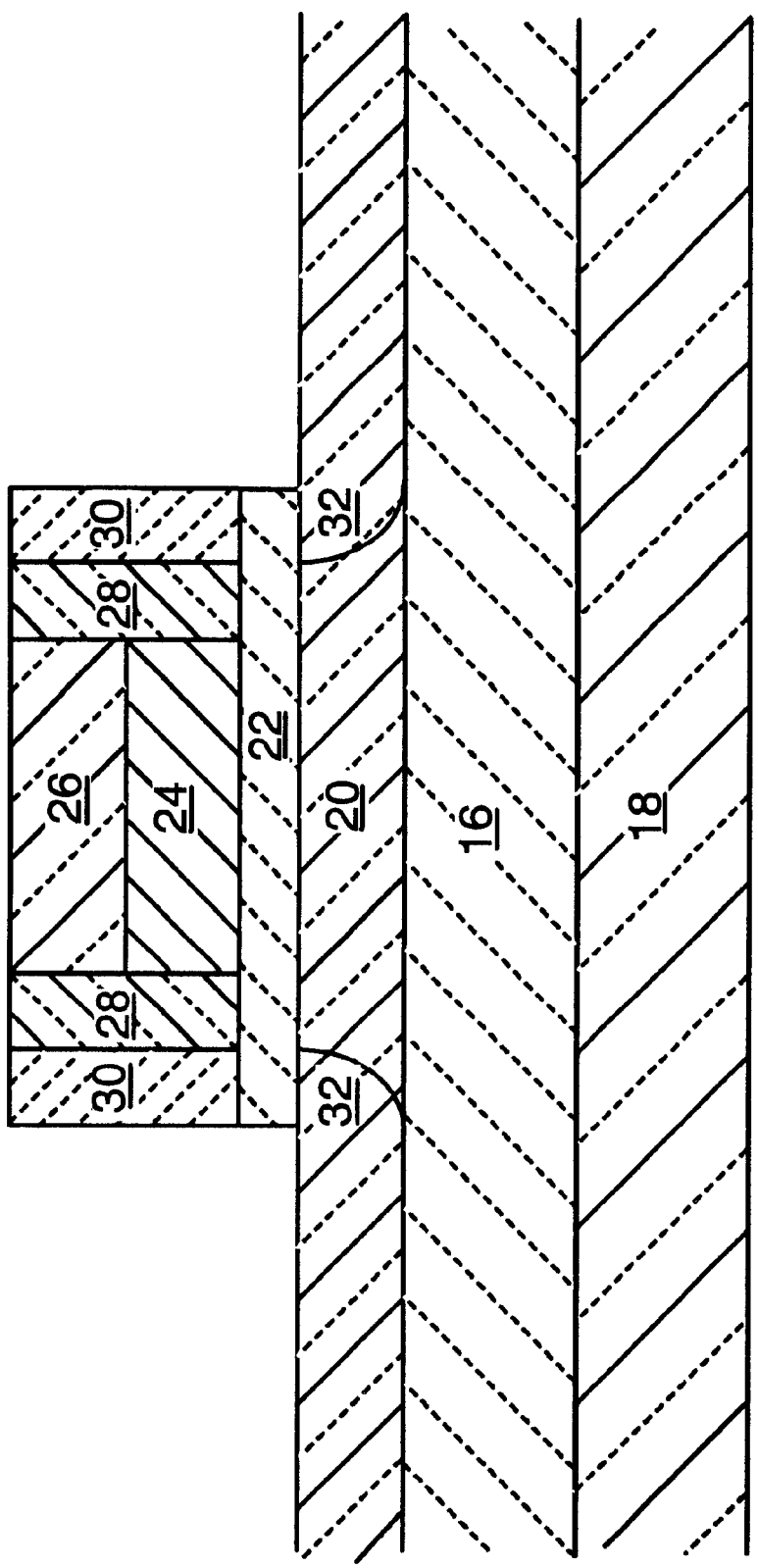
FIG. 2b shows the intermediate inventive device structure having inner dielectric spacers and extension implanted regions.
Figure 2C:
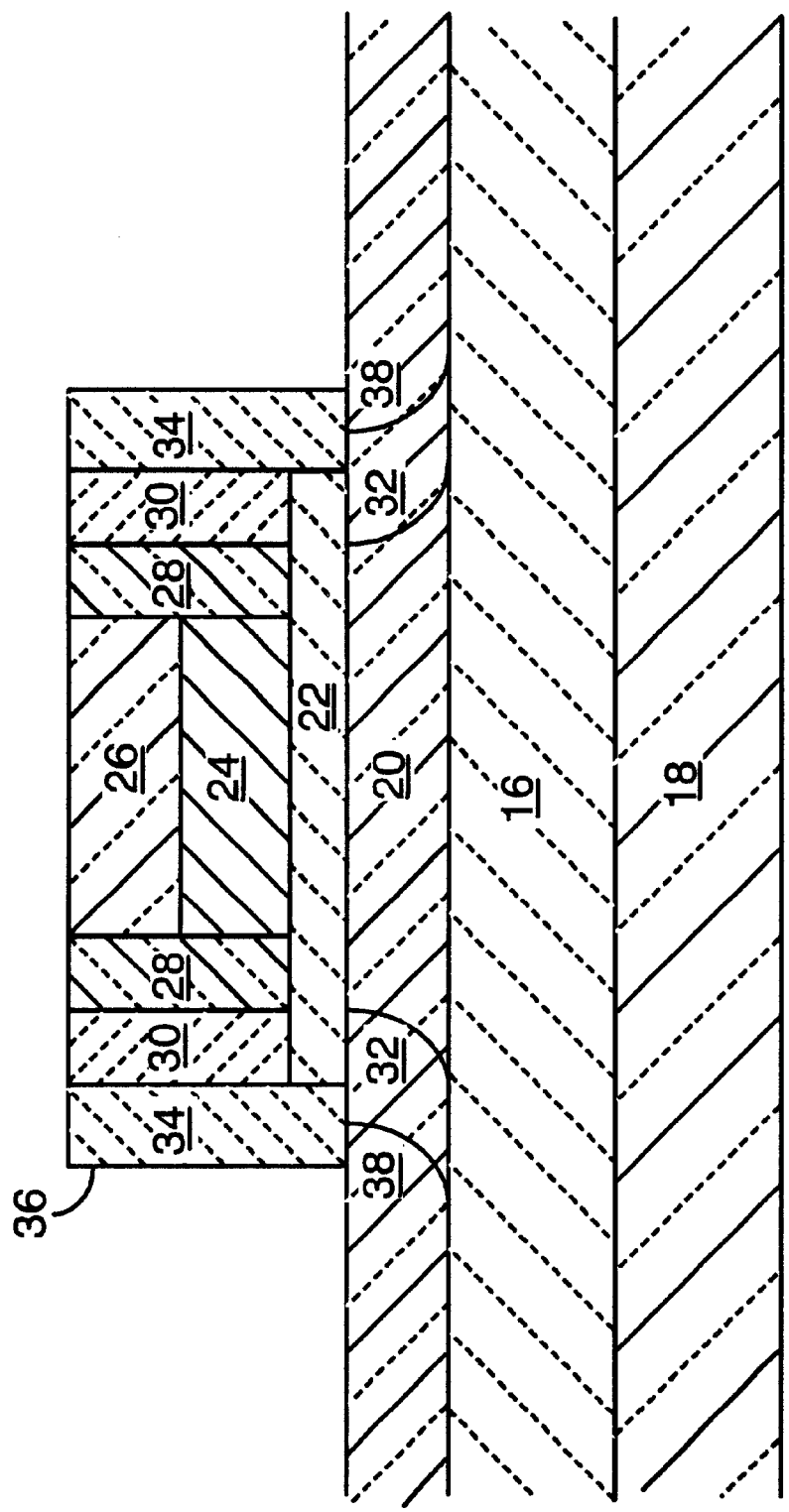
FIG. 2c shows the final inventive device structure having outer dielectric spacers and source/drain implanted regions.

FIGS. 2a–2c show the inventive device structures. FIG. 2a shows buried oxide layer 16, usually undoped $SiO_2$ with thickness of approximately 50–60 nm, atop bulk substrate 18. Thin undoped silicon layer 20 of the SOI has a thickness of approximately 5–20 nm. Gate dielectric 22 is comprised of silicon dioxide or alternately silicon nitride, aluminum oxide, tantalum pentoxide or hafnium oxide with equivalent oxide thickness of 0.8–1.4 nm. Conducting metal gate 24 is deposited and patterned from TiN, TaN, TaW. W. Al, Ni, Ta, Mo, or Cr, and has thickness of approximately 2.5–25 nm, with gate length of 30–60 nm. Polysilicon encapsulation layer 26 with thickness of 50–100 nm is deposited on and patterned with gate 24. (Encapsulation layers in general are necessary to prevent cross-contamination of the fab line during post-gate formation processing.) 10–15 nm polysilicon is deposited and anisotropically etched to form poly spacers 28 which when doped function as side gates.

FIG. 2b shows first dielectric spacers 30, formed by depositing 10–20 nm silicon nitride or silicon dioxide followed by anisotropic etch. The dielectric spacer etch removes the exposed portions of gate dielectric 22. Extension implanted regions 32 are formed following formation of first dielectric spacers 30. The extension implants may be comprised of 1–2e14/$cm^2$ $BF_2$ at 10–15 keV for p-channel, or 0.5–2e14/$cm^2$ As at 3–5 keV for n-channel, by way of example. RTA anneal for 5–10 seconds at 900–950 C follows.

FIG. 2c shows second dielectric spacers 34, formed by depositing 50–90 nm of silicon nitride or silicon dioxide followed by anisotropic etch. Sidewalls 36 of spacers 34 may be vertical or sloped. Source/drain implanted regions 38 are formed following formation of second spacers 34. Polysilicon spacers 28 are also doped during source/drain implantation. The source/drain implants may be comprised of 1–2e15/$cm^2$ of B at 2–3 keV for p-channel, or 1–2e15/$cm^2$ of P at 7.5–12.5 keV for n-channel, by way of example. RTA anneal for 5–10 seconds at 950–1025 C follows. Formation of approximately 5 nm of nickel silicide may follow.

My inventive structure, which comprises double spacers, one set of polysilicon spacers, and at least one set of dielectric spacers, enables the source/drain extension implanted regions to be moved away from under the doped polysilicon side gate, thereby reducing overlap capacitance. Device simulations of the inventive device structure using the Medici simulation program by Avanti show that the DC $I_{off}$ characteristics are comparable to those achieved with only polysilicon spacers; the $I_{on}$ characteristics are within 2–3% of those achieved with only polysilicon spacers. The AC characteristics, specifically the inverter ring oscillator stage delay, are significantly improved compared to a device having only polysilicon spacers. The AC characteristics are within 10% of the values achieved with devices having only silicon nitride spacers, but with much improved short channel control.

It is not intended that the invention be restricted to the exact embodiments described herein. For example, the processing details, including temperatures, times, implant energies and doses, and exact metal and dielectric materials used, may be altered without departing from the inventive concept. Additionally, the dielectric spacers may be comprised of a single first set of oxide or nitride spacers rather than the first and second dielectric spacers disclosed herein. The scope of the invention should be construed in view of the claims.

With this in mind,

I claim:

1. In a Silicon-On-Insulator (SOI) device including a bulk substrate (18), a buried oxide layer (16), an ultra thin SOI silicon layer (20), field oxide regions (7), a gate dielectric layer (22), a conducting gate (24) having gate sidewalls, gate sidewall spacers (11), doped source and drain implanted regions (12) including extension implanted regions (32), and a channel region (14), the improvement comprising:

said gate sidewall spacers comprising an inner pair of spacers, said inner pair of spacers being doped polysilicon spacers (28) contiguously on said gate sidewalls, said gate sidewall spacers further comprising an outer pair of spacers (30), said outer pair of spacers being dielectric spacers, said dielectric spacers being contiguously on said doped polysilicon spacers on the side opposite said gate sidewalls;

said extension implanted regions (32) not being vertically directly beneath said doped polysilicon spacers (28).

2. The SOI device of claim 1, wherein said dielectric spacers are comprised of silicon nitride or silicon dioxide.

3. The SOI device of claim 2, wherein:

said buried oxide layer has a thickness between 50 and 60 nm;

said ultra thin SOI silicon layer has a thickness between 5–20 nm;

said gate dielectric layer is comprised of one of the group consisting of silicon dioxide, silicon nitride, aluminum oxide, tantalum pentoxide, and hafnium oxide;

said gate dielectric layer has an equivalent silicon dioxide thickness between 0.8–1.4 nm;

said conducting gate is comprised of one of the group consisting of TiN, TaN, TaW, W, Al, Ni, Ta, Mo, and Cr;

said conducting gate has a thickness between 2.5 and 25 nm;

said conducting gate has a length between 30 and 60 nm;

said conducting gate having a top surface with a polysilicon encapsulation layer thereon, said polysilicon encapsulation layer having a thickness between 50 and 100 nm;

said doped polysilicon spacers having a width between 10 and 15 nm;

said dielectric spacers having a width between 10 and 110 nm.

* * * * *